(12) United States Patent
Dent (10) Patent No.: US 7,456,772 B2
(45) Date of Patent: Nov. 25, 2008

(54) FAST, HIGH RESOLUTION DIGITAL-TO-ANALOG CONVERTER

(75) Inventor: Paul Wilkinson Dent, Pittsboro, NC (US)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 11/612,551

(22) Filed: Dec. 19, 2006

(65) Prior Publication Data

US 2008/0143564 A1 Jun. 19, 2008

(51) Int. Cl.
*H03M 1/66* (2006.01)

(52) U.S. Cl. .............. 341/144; 341/145; 341/146

(58) Field of Classification Search .......... 341/144–154
See application file for complete search history.

(56) References Cited

U.S. PATENT DOCUMENTS

| | | | | |
|---|---|---|---|---|
| 3,646,545 A | * | 2/1972 | Naydan et al. | 341/152 |
| 4,862,170 A | * | 8/1989 | Hashimoto et al. | 341/144 |
| 4,940,978 A | * | 7/1990 | Mycynek | 341/150 |
| 5,805,909 A | * | 9/1998 | Diewald | 713/322 |
| 6,104,327 A | * | 8/2000 | Maki | 341/101 |
| 6,295,014 B1 | * | 9/2001 | Eastty et al. | 341/143 |
| 6,621,439 B1 | * | 9/2003 | Bugeja | 341/145 |
| 6,664,909 B1 | * | 12/2003 | Hyde et al. | 341/144 |
| 6,897,797 B2 | * | 5/2005 | Zhao et al. | 341/144 |

FOREIGN PATENT DOCUMENTS

GB 1459674 12/1976

OTHER PUBLICATIONS

Carbrey, R. L. "Decoding in PCM." Record-Bell Laboratories, Nov. 1948, pp. 451-456. XP008095915.

* cited by examiner

*Primary Examiner*—Linh V Nguyen
(74) *Attorney, Agent, or Firm*—Coats & Bennett, P.L.L.C (57) ABSTRACT

A fast, high resolution digital-to-analog converter (DAC) is described herein. The DAC comprises a pulse generator, decay circuit, controller, and sample circuit. The pulse generator serially outputs pulses representing digits of a digital word least significant digit first. Each pulse generates a response in the decay circuit that decays over time according to a known decay response. One exemplary decay circuit comprises an RC circuit having an exponential decay response. The controller controls the timing of the pulses output by the pulse generator such that the period of each pulse relates to a predetermined decay amount. The sample circuit samples an output of the decay circuit at a sample time after the decay circuit receives the pulse for the most significant digit. The sampled output represents the analog value corresponding to the input digital word. The digital word may have any length, radix, or format.

34 Claims, 13 Drawing Sheets

FAST, HIGH RESOLUTION DIGITAL-TO-ANALOG CONVERTER

BACKGROUND

This invention relates generally to digital-to-analog converters, and more particularly to fast, high resolution digital-to-analog converters applicable to digital words in fixed point, floating point, and logarithmic formats.

Digital-to-analog converters convert digital words into analog values, such as analog voltage values or analog current values. Digital words may be binary, ternary, etc., and may be expressed in any known format, such as a fixed-point, a floating point, or a logarithmic format. When the digital word is a fixed-point binary word having n bits (d), the corresponding analog value S may be generated by applying progressive power of two weightings to each bit.

An R-2R ladder network represents one conventional digital-to-analog converter that uses a network of resistor stages to apply the progressive weightings to each bit. Each stage of the network uses the same pair of resistors, where the resistance of one resistor is twice the resistance of the other resistor. By connecting n stages together, the R-2R ladder network applies reciprocal ratios $1:\frac{1}{2}:\frac{1}{4}: \ldots :2^{-(n-1)}$ to the input bit values to convert an n-bit digital word into an analog value.

Accurate conversion from the digital domain to the analog domain using an R-2R ladder network requires highly accurate reciprocal ratios. Thus, R-2R ladder networks require high precision resistors, particularly for large digital words. Because it is difficult to maintain the requisite precision across a large number of resistors, R-2R ladder networks typically do not have sufficient accuracy for large digital words. While other conventional digital-to-analog converters may improve the accuracy, these digital-to-analog converters typically do so using highly complex and/or computationally slow circuitry. Therefore, there remains a need for fast, high resolution digital-to-analog converters.

SUMMARY

The present invention comprises a fast, high resolution digital-to-analog converter (DAC). The DAC comprises a pulse generator, decay circuit, controller, and sample circuit. The pulse generator serially outputs pulses representing digits of a digital word ordered from the least significant digit to the most significant digit. Each pulse input from the pulse generator into the decay circuit generates a response that decays over time according to the decay response of the decay circuit. The controller controls the timing of the pulses output by the pulse generator such that the period of each pulse relates to a predetermined decay amount. responsive to a control signal from the controller, the sample circuit samples an output of the decay circuit at a sample time after the pulse generator inputs the pulse for the most significant digit into the decay circuit. The sampled output represents the analog output value corresponding to the input digital word.

In one exemplary embodiment, the input digital word comprises a binary word and the decay circuit comprises an RC circuit having an exponential decay response. The pulse generator streams pulses corresponding to the binary word, least significant bit pulse first, into the RC circuit. After the most significant bit pulse is input, the sample circuit samples the output voltage of the RC circuit. The sampled voltage is an accurate analog representation of the binary word when the controller controls the bit period of the pulses based on the RC time constant.

In another exemplary embodiment, the input digital word comprises a magnitude portion and an exponent portion. For example, the input digital word may comprise a floating point word that comprises a magnitude portion and an integer exponent portion. Alternatively, the input digital word may comprise a logarithmic word that comprises a magnitude portion and a fractional exponent portion By allowing the response to the magnitude input pulses to further decay for a period of time based on the exponent portion, the digital-to-analog converter of the present invention generates an analog output for a floating point or logarithmic word. In one embodiment, the digital-to-analog converter accomplishes this additional decay by varying the sample time relative to an input pulse start time as a function of the exponent. In another embodiment, the digital-to-analog converter accomplishes this additional decay by varying the input pulse start time relative to the sample time as a function of the exponent.

DETAILED DESCRIPTION

Figure 1:
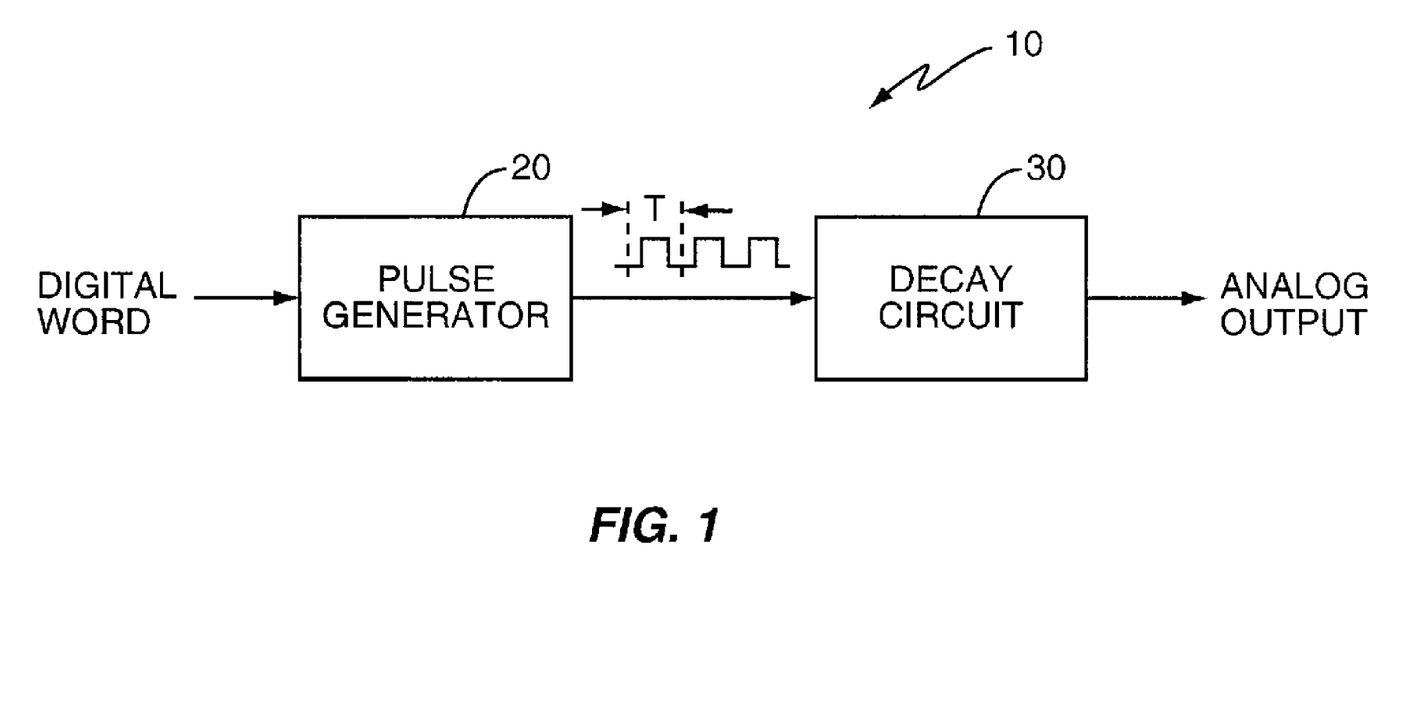
FIG. 1 shows a block diagram of one exemplary digital-to-analog converter.

FIG. 1 shows a block diagram of an exemplary digital-to-analog converter (DAC) 10 comprising a pulse generator 20 and a decay circuit 30. According to the present invention, pulse generator 20 serially outputs pulses corresponding to the bits of the input digital word ordered from least significant bit (LSB) to most significant bit (MSB). The input pulses to the decay circuit 30 generate a response that decays according to a known decay response. More particularly, as pulse generator 20 inputs each pulse into decay circuit 30, the responses generated by the previously input pulses decay by a desired decay factor for each period. For example, as each pulse corresponding to a bit of a binary word is input to decay circuit 30, the responses generated by the previously input pulses nominally decay by a factor of two for each bit period. After the MSB pulse is input, the output of decay circuit 30 represents the analog value corresponding to the input digital word. While the following generally describes DAC 10 in terms of a 4-bit binary word, it will be appreciated that the present invention applies to any length digital words having any radix, such as ternary digital words, quaternary digital words, etc.

Figure 2:
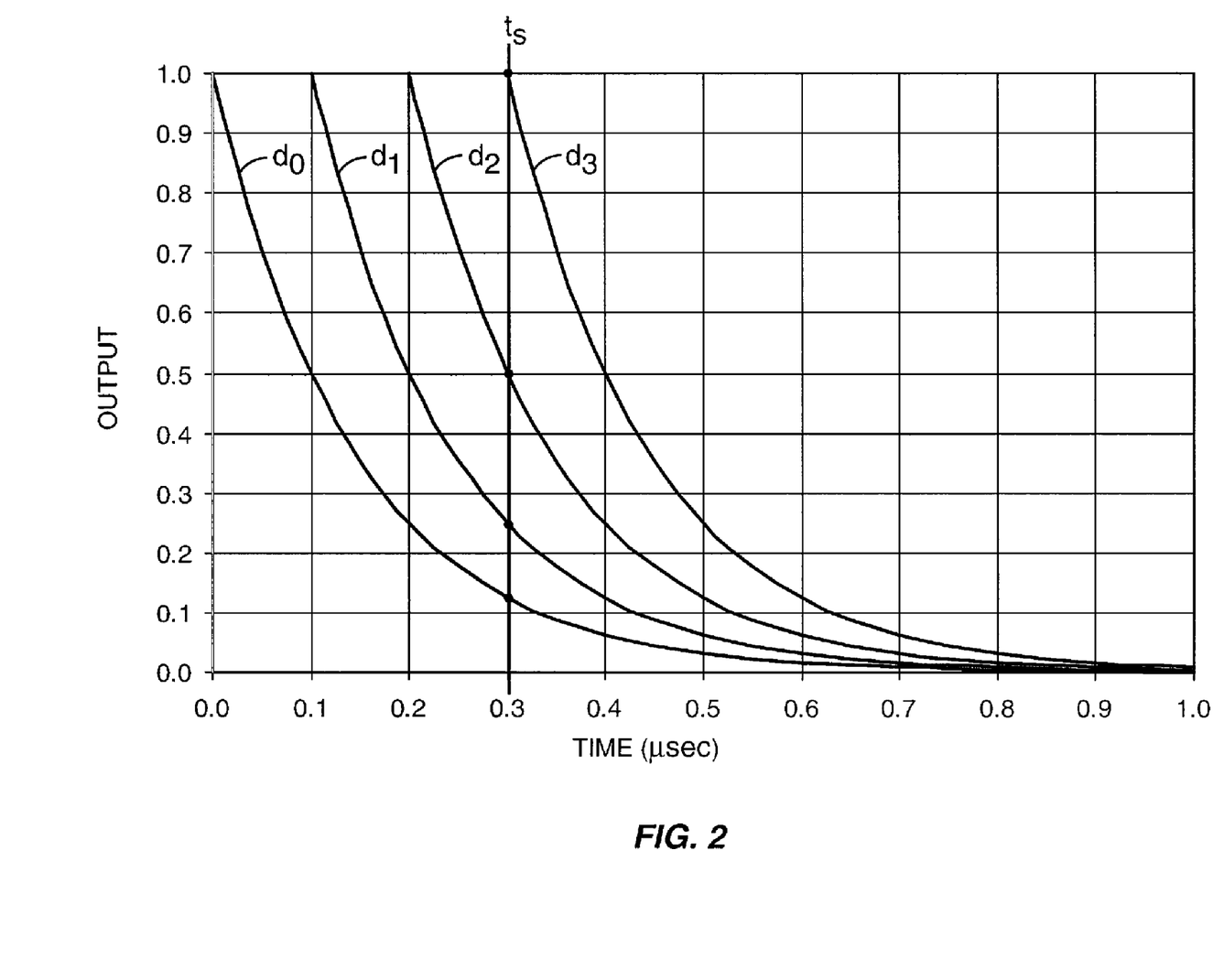
FIG. 2 illustrates the decaying function of the digital-to-analog converter of FIG. 1.

FIG. 2 illustrates an exemplary exponential decay response for a decay circuit 30 that has received pulses corresponding to a 4-bit binary word "1111." For this example, the period for each pulse is 0.1 µsec. As successive pulses are input, the response generated by each pulse decays by a factor of two during each bit period. Thus, by time $t_s$, the response generated by $d_0$, which represents the LSB bit, has decayed by a factor of $2^{-3}$, the response generated by $d_1$ has decayed by a factor of $2^{-2}$, and the response generated by $d_2$ has decayed by a factor of $2^{-1}$. At time $t_s$, the cumulative analog value at the output of the DAC 10 is given by:

$$S = d_3 2^0 + d_2 2^{-1} + d_1 2^{-2} + d_0 2^{-3} \qquad (1)$$

As shown in Equation (1), DAC 10 applies a progressive power of two to each bit of the a 4-bit binary word. Thus, the output of DAC 10 at time $t_s$ accurately represents the analog value of the input digital word.

Figure 3:
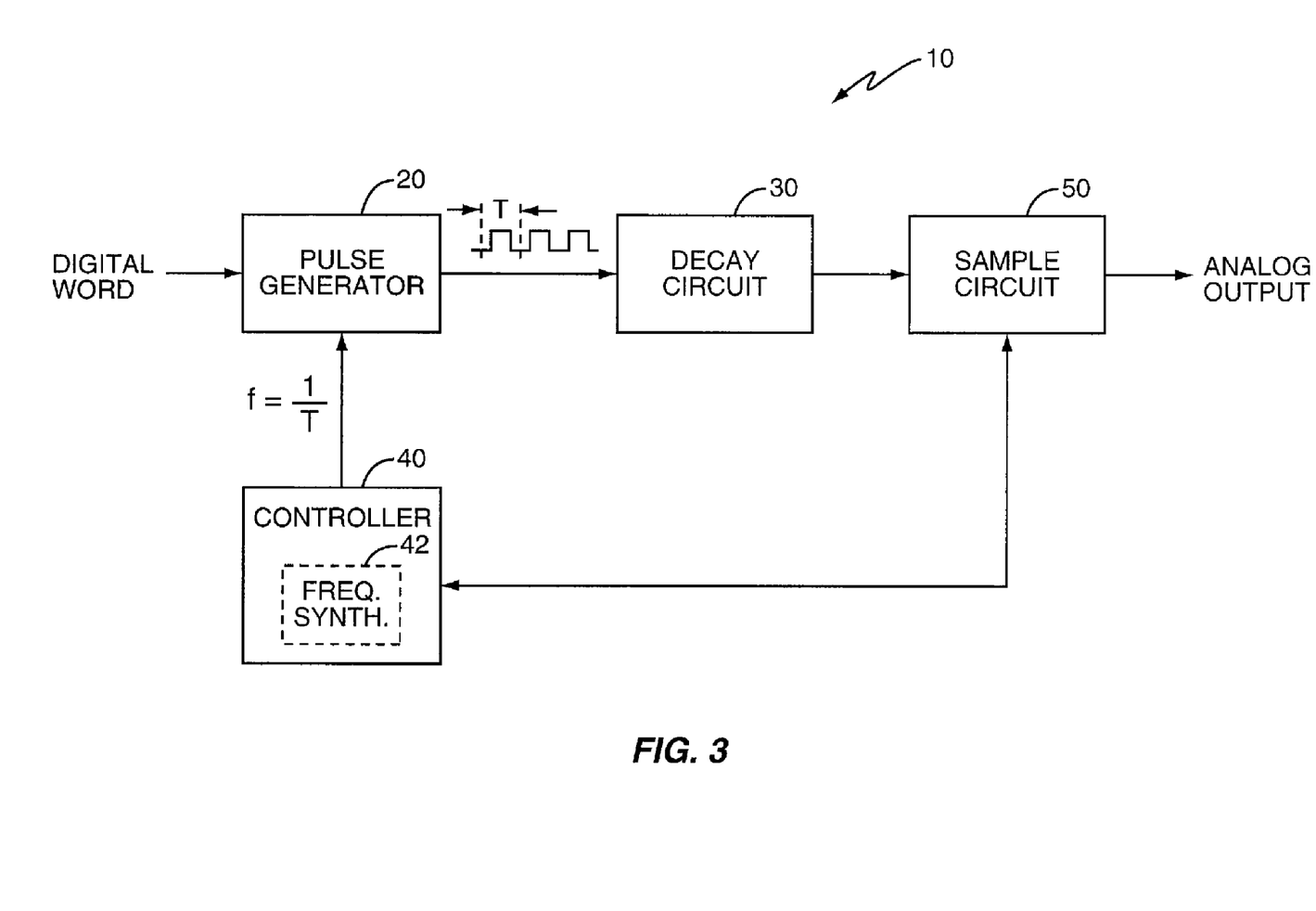
FIG. 3 shows a block diagram of one embodiment of a digital-to-analog converter of the present invention.

FIG. 3 shows a more detailed block diagram of one exemplary DAC 10 according to the present invention. DAC 10 includes pulse generator 20, decay circuit 30, a controller 40, and a sample circuit 50. Pulse generator 20 converts the input digital word into a series of pulses, where each pulse has a period T, and outputs the pulses LSB pulse first. As an example, consider the 4-bit binary word "1011." Pulse generator 20 converts this digital word to the series of pulses shown in FIG. 3.

The response generated by each input pulse decays according to a known decay response of the decay circuit 30. Controller 40 controls pulse generator 20 to control the timing of the pulses relative to the decay response of the decay circuit 30 such that the period T of each pulse relates to a predetermined decay factor. For example, the decay response may cause the response generated by each input pulse to decay by a factor of 2 for each bit period of a binary word. Responsive to a control signal from controller 40, sample circuit 50 samples the output of the decay circuit 30 at a sample time $t_s$ after the pulse generator 20 inputs the MSB pulse. The sampled output represents the analog value corresponding to the input digital word.

Figure 4:
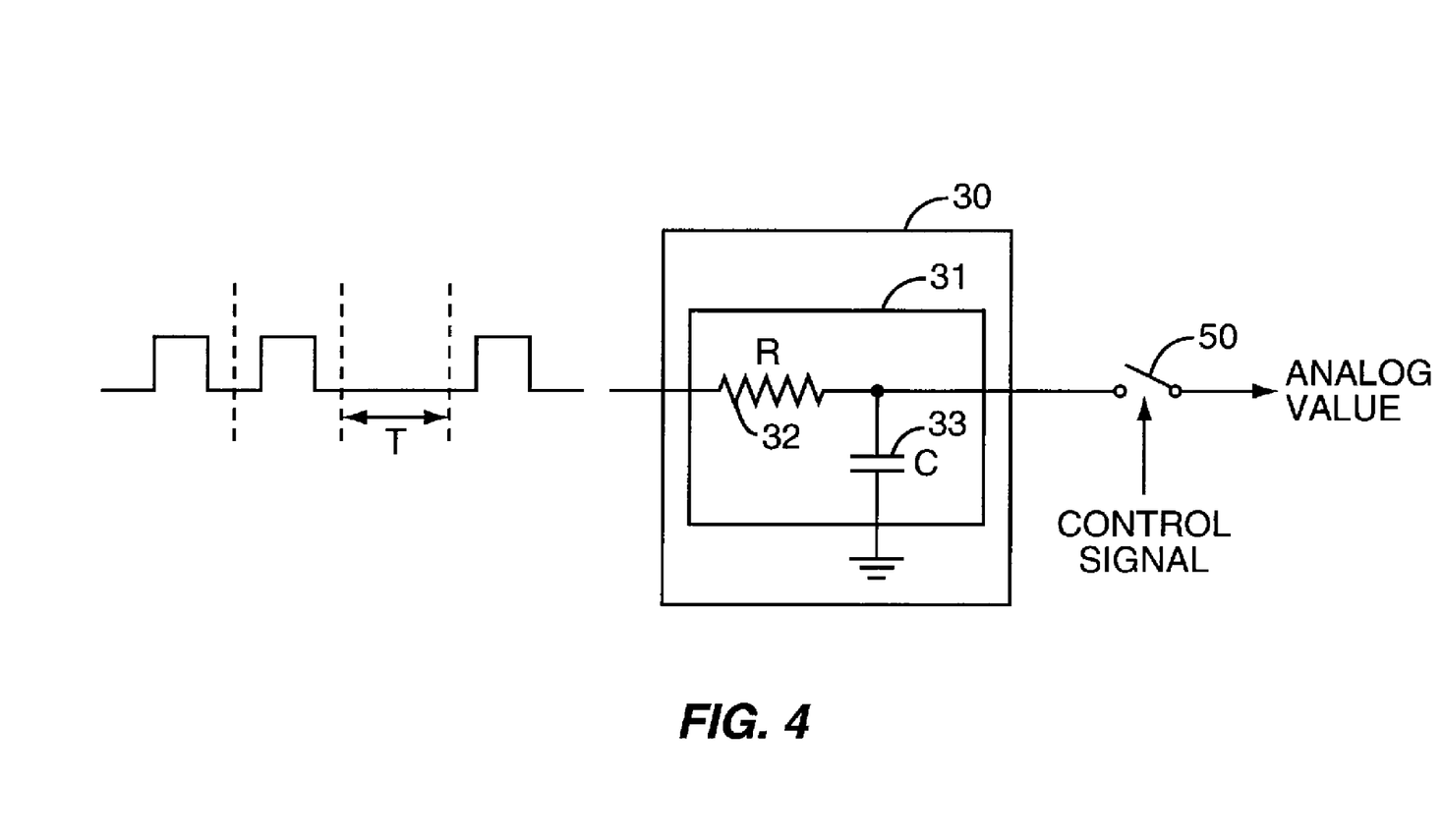
FIG. 4 shows one exemplary decay circuit for the digital-to-analog converter of FIG. 3.

FIG. 4 shows one exemplary decay circuit 30 comprising an RC circuit 31 having a resistor 32 in series with the source providing the input pulses and a shunt capacitor 33. The impulse response of the RC circuit 31 exhibits an exponential decay response defined by:

$$v(t) = V e^{-t/\tau}, \qquad (2)$$

where V represents the amplitude of the input pulses and $\tau = RC$ represents the time constant of the RC circuit 31. It will be appreciated that decay circuit 30 is not limited to the illustrated RC circuit. In other exemplary embodiments, decay circuit 30 may decay the response generated by each input pulse according to any known decay response. For example, decay circuit 30 may have any nonlinear decay response. For this embodiment, the output of decay circuit 30 at any instant in time is the convolution between the input pulses and the impulse response of the RC circuit 31.

To ensure that the response generated by each pulse decays by the desired decay amount, controller 40 controls the input pulse timing relative to the decay response of the decay circuit 30 according to:

$$T = RC \ln(a). \qquad (3)$$

In Equation (3), T represents the period of the input pulses, R represents the resistance of resistor 32 in ohms, C represents the capacitance of capacitor 33 in Farads, and a represents the radix of the input digital word. For binary words, a=2, and the nominal decay amount for each period is ½, which corresponds to a nominal decay factor DF=2. In one embodiment, controller 40 controls the input pulse timing by controlling the period T of each pulse such that the period of each pulse relates to the desired decay amount. In another embodiment, controller 40 controls the input pulse timing by controlling the resistance and/or capacitance of RC circuit 31 to control the time constant $\tau$ such that the desired decay amount relates to the period T of the input pulses.

By precisely controlling the period T and/or the RC time constant $\tau$, controller 40 may control the accuracy of the output analog value. Typically, digital-to-analog converters should be accurate to 0.5 LSB, which corresponds to an accuracy of approximately 15 parts per million. The above-described DAC 10 provides the desired accuracy for large digital words, including 16-bit digital words, as long as the DAC 10 is monotonic. In other words, if the signal value generated for the value "1000000000000000" is slightly larger than the signal value generated for "0111111111111111," the DAC 10 is monotonic. DAC 10 is monotonic when:

$$w + w^2 + w^4 + \ldots w^{15} < 1, \qquad (4)$$

where w represents the desired decay amount per period. For binary words, Equation (4) results in $w < 0.5(1+2^{-15}) = 0.5000152$, which provides an accuracy of $0.5000152^{15}$, or approximately 30 parts per million, which is more than sufficient to meet the 0.5 LSB accuracy requirement. It will be appreciated that the DAC 10 described herein may be used for even longer digital word, including 32-bit digital words, as long as the DAC 10 is monotonic.

DAC 10 achieves this accuracy if the product of the bit frequency (f=1/T) and the RC time constant $\tau$ meet this accuracy requirement. To that end, controller 40 may include a programmable frequency synthesizer 42 (FIG. 3) to precisely set the period T of the pulses output by pulse generator 20. In one embodiment, frequency synthesizer 42 may calibrate the bit period relative to the decay response of decay circuit 30. For this embodiment, digital words alternating between "1000000000000000" and "0111111111111111" are input to DAC 10. By evaluating the output of the decay circuit 30 for each input digital word, the controller 40 may determine the error in the period of the input pulses. Controller 40 may then use the programmable frequency synthesizer 42 to adjust the period of the pulses based on the error. For example, if the programmable frequency synthesizer 42 is nominally set to 160 MHz, 2400 Hz steps equates to 15 parts per million steps. Thus, to achieve an accuracy of 15 parts per million, frequency synthesizer 42 may adjust the frequency of the pulse generator 20 in 2400 Hz steps to set the desired period for the pulse generator 20.

Controller 40 may also use the frequency synthesizer 42 during operation of the DAC 10 to dynamically adjust the period of the input pulses to correct for dynamically occurring errors. For example, if the resistor 32 and/or capacitor 33 in RC circuit 31 vary with temperature, controller 40 may track the error caused by the temperature variations and use the frequency synthesizer 42 to dynamically adjust the bit period based on the error. For example, if the precise departure from exponential decay of the decay circuit 30 is known, the frequency synthesizer 42 may be tuned using a preprogrammed sequence to adjust each bit interval to compensate for the departure, and also for temperature if necessary. In one embodiment, an oscillator may be constructed with the same resistors and capacitors as used in the RC circuit 31. The controller 40 may measure the frequency of the oscillator to any desired accuracy. Based on the measured frequency, the controller 40 may adjust the bit period of the frequency synthesizer 42. It will be appreciated that while the DAC 10 of FIG. 3 includes the controller 40 and frequency synthesizer 42, one or more DACs 10 may use the same controller 40, frequency synthesizer 42, and/or temperature compensation circuitry when the time constant of all DACs 10 match. For example, a stereo audio digital-to-analog converter having two channels may be constructed with one controller 40, one frequency synthesizer 42, one temperature compensation circuit, and two DACs 10 (one for each channel).

Even if controller 40 can precisely control the period T and/or RC time constant $\tau$, the analog value output by RC circuit 31 may still include errors caused by spurious signals introduced by incidental poles. Typically, an ideal RC circuit 31 has a primary pole at a frequency proportional to $1/\tau$. However, in reality RC circuit 31 may have one or more incidental poles that cause the RC circuit 31 to introduce spurious signals into the decay circuit output. Typically, the incidental poles are at a higher frequency than the primary pole. The higher frequency causes the spurious signals to decay exponentially at a faster rate than the signals associated with the primary pole. For example, if the RC circuit 31 has an incidental pole at 10 times the primary pole frequency, the spurious signal decays 10 times faster than the signals associated with the primary pole. Thus, to substantially attenuate the spurious signals, controller 40 may control sample circuit 50 to delay the sample time for a predetermined period after the MSB pulse is input. Alternatively, controller 40 may control pulse generator 20 to advance the input of the pulses for a predetermined period relative to the sample time. Either option allows the spurious signals to decay to an acceptably small value before the sample time. It will be appreciated that DAC 10 may further include an amplifier (not shown) to boost the output analog value to compensate for the lost amplitude resulting from the additional delay.

Figure 5:
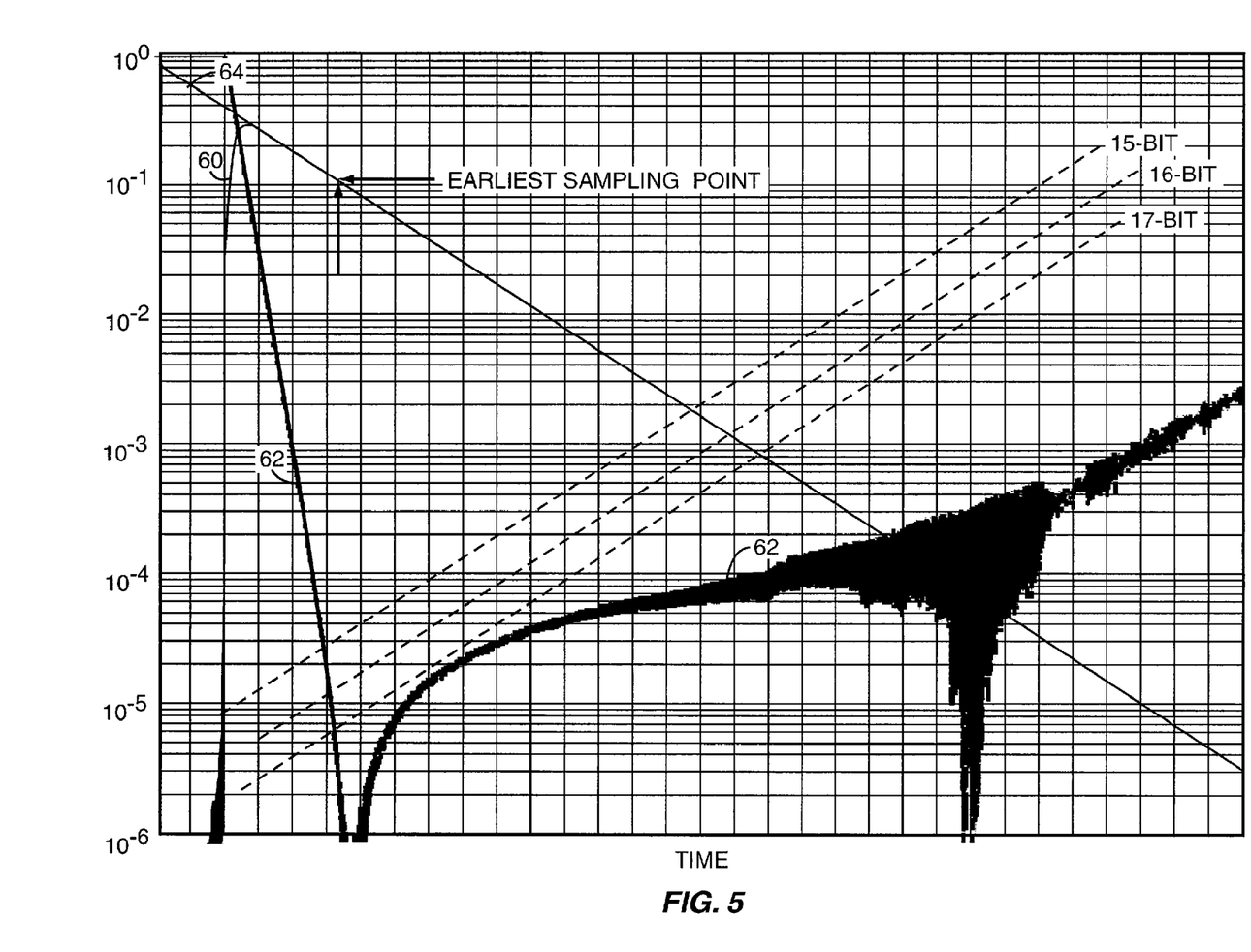
FIGS. 5-7 show performance data for various embodiments of the decay circuit of FIG. 4.
Figure 6:
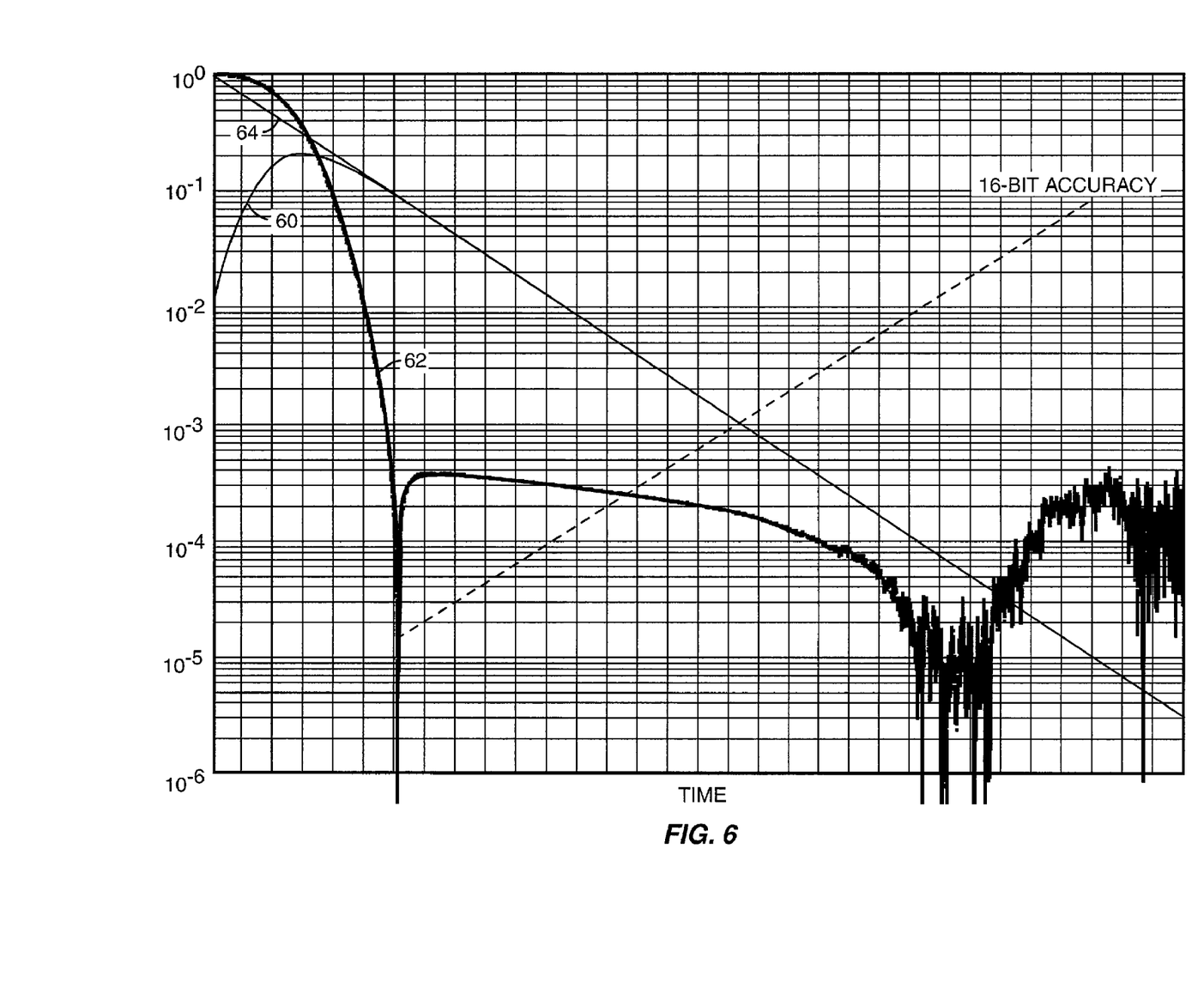
Figure 7:
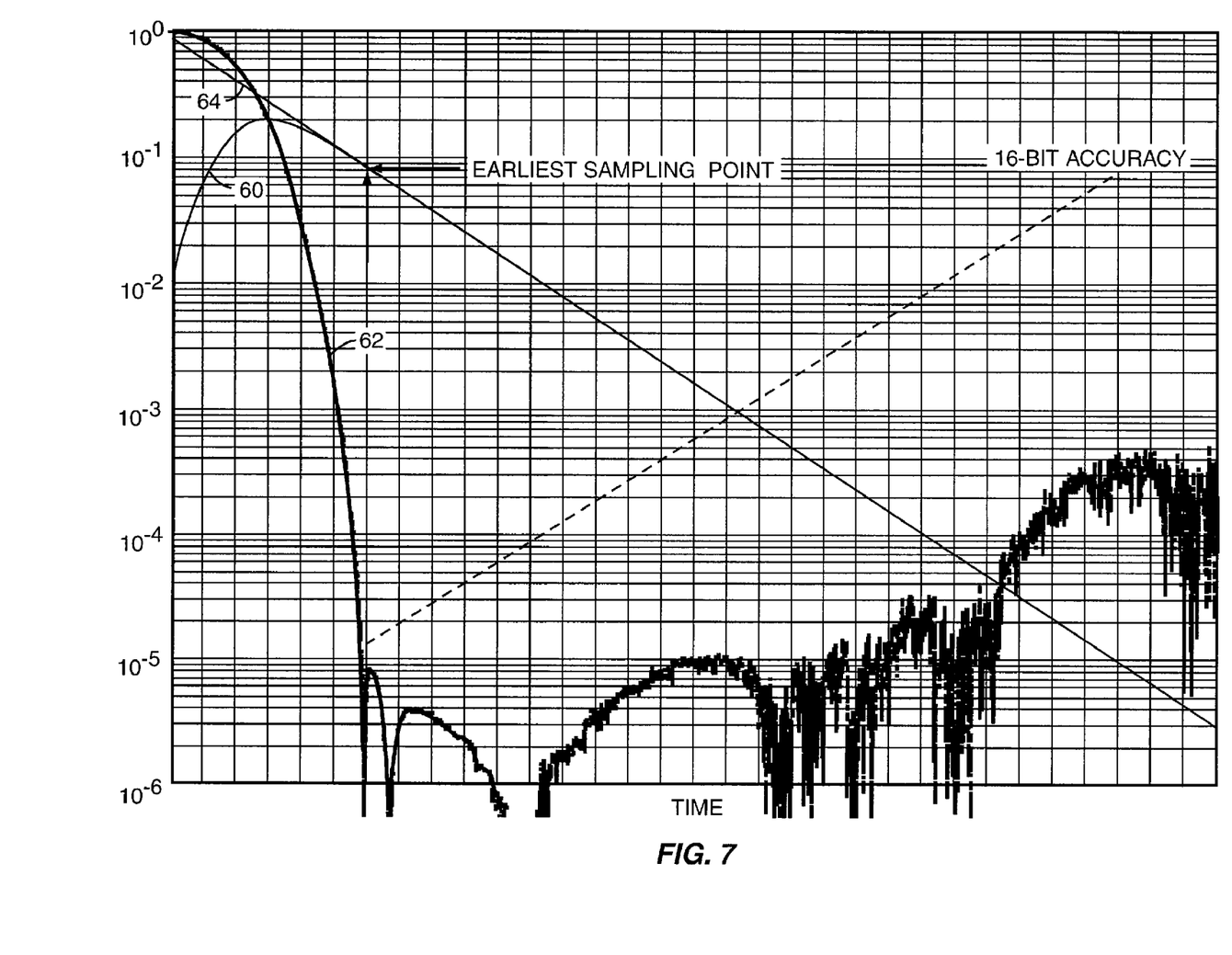

FIGS. 5-7 show the impulse response of the RC circuit 31 plotted on a logarithmic scale to illustrate the problems and potential solutions for the incidental pole problem. FIG. 5 shows the impulse response 60 of an RC circuit 31 having an incidental pole at 10 times the frequency of the primary pole. FIG. 5 further shows the error 62 between the impulse response 60 subject to the spurious signals and an ideal straight line response 64. As illustrated, the impulse response 60 and the error 62 have approximately the same magnitude at the peak of the impulse response. Therefore, in this example spurious signals cause the analog value obtained by sampling at the peak to be severely inaccurate.

To achieve a desired accuracy of less than 0.5 LSB, error 62 should be less than 1/65536 for the MSB, 1/32768 for the $2^{nd}$ MSB, etc. The dotted lines in FIG. 5 show the error limits for 15-bit, 16-bit, and 17-bit words, respectively, having an accuracy of at least 0.5 LSB. In order to meet the desired accuracy, the error 62 must be below the error limit for the word length at the sample time. As shown in FIG. 5, error 62 does not fall below the error limit for a 16-bit word until the impulse response has decayed by approximately 9 dB. By delaying the sample time of the decay circuit output until this point, controller 40 substantially eliminates the spurious signals from the sampled value.

While sufficiently delaying the sampling of the decay circuit output will often overcome the problems associated with incidental poles, the required delay may be undesirably long. Further, when the incidental pole frequency is relatively close to the primary pole frequency, the resulting error 62 may be too large to overcome by simply delaying the sample time. For example, consider the scenario when the incidental pole frequency is twice the primary pole frequency, as shown in FIG. 6. The error 62 for this scenario is too large to achieve the desired accuracy, even if the sample time is significantly delayed. To correct this problem, RC circuit 31 may further include a second resistor in series with capacitor 33 that forms a zero in the frequency response of the RC circuit 31 response. Generally matching the time constant of the zero to the first order coefficient of all other incidental poles substantially reduces the spurious signals. FIG. 7 illustrates how forming a zero at approximately 10 times the primary pole frequency using the second resistor sufficiently reduces the error 62 shown in FIG. 6. Thus, by forming a zero at the appropriate frequency and by delaying the sample time, DAC 10 may compensate for even the most degrading spurious signals.

The exemplary DAC 10 described above assumes fixed point digital words. However, DAC 10 may also be applied to digital words in other formats, such as floating point and/or logarithmic formats. Digital words in a floating point or logarithmic format include a sign, a magnitude, and an exponent. For binary words, the floating point word may be represented as $s \cdot r \cdot 2^{-m}$, where s represents the sign, r represents the magnitude, and m represents the exponent. The exponent m is an integer for floating point words and a fraction for logarithmic words. It will be appreciated that fixed point digital words correspond to floating point digital words when m=0. It will also be appreciated that the analog values for digital words having different exponents differ by some factor of two. For example, when the magnitude is 12, the output value is 12 when m=0, 6 when m=1, 3 when m=2, etc. As a result, by modifying DAC 10 to allow the response generated by the input pulses corresponding to the magnitude bits to further decay for a period of time proportional to m, the DAC 10 accommodates digital words in a floating point and/or a logarithmic format.

Figure 8:
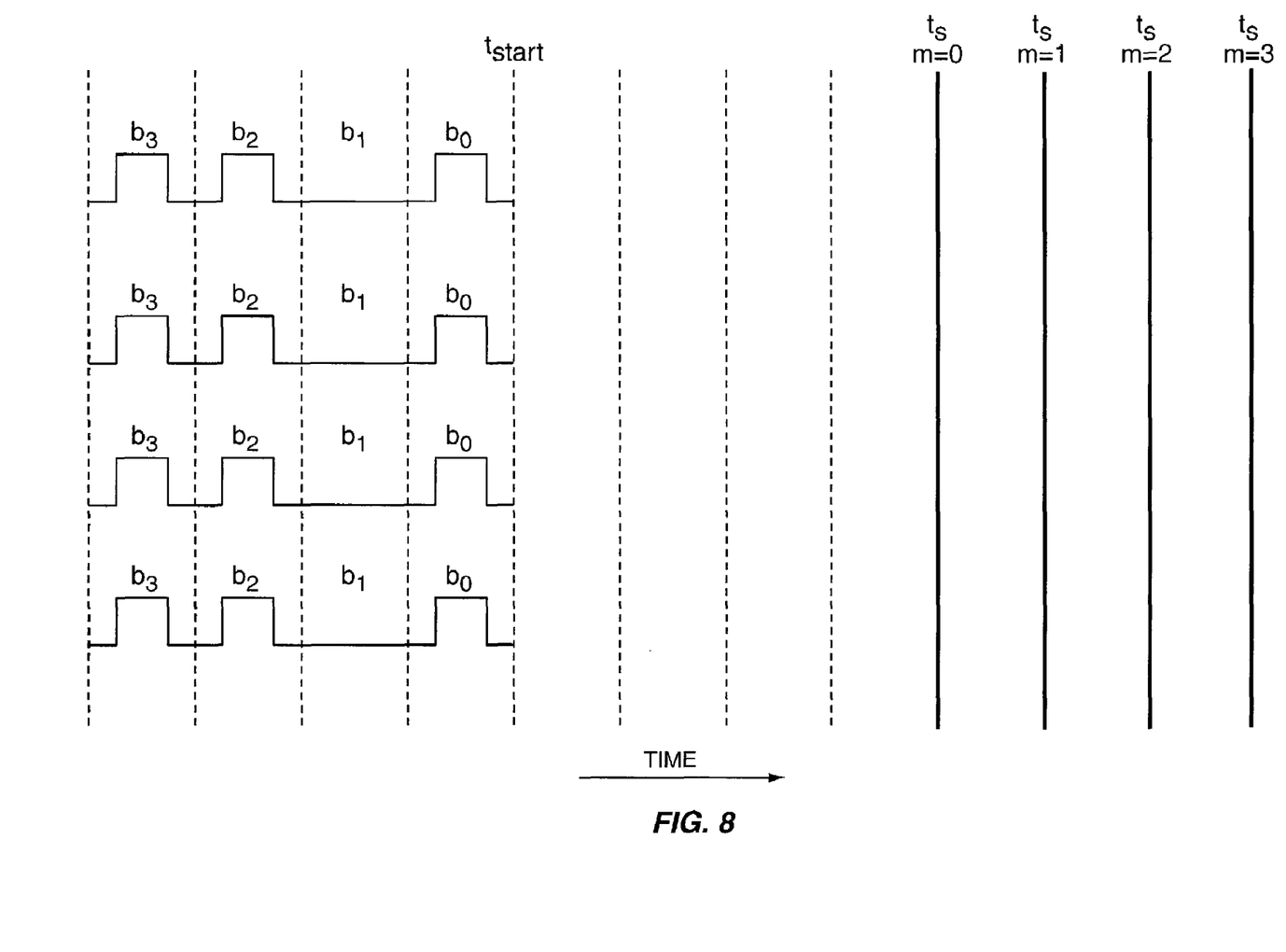
FIG. 8 shows the decaying function of the digital-to-analog converter of FIG. 3 at different sampling times.
Figure 9:
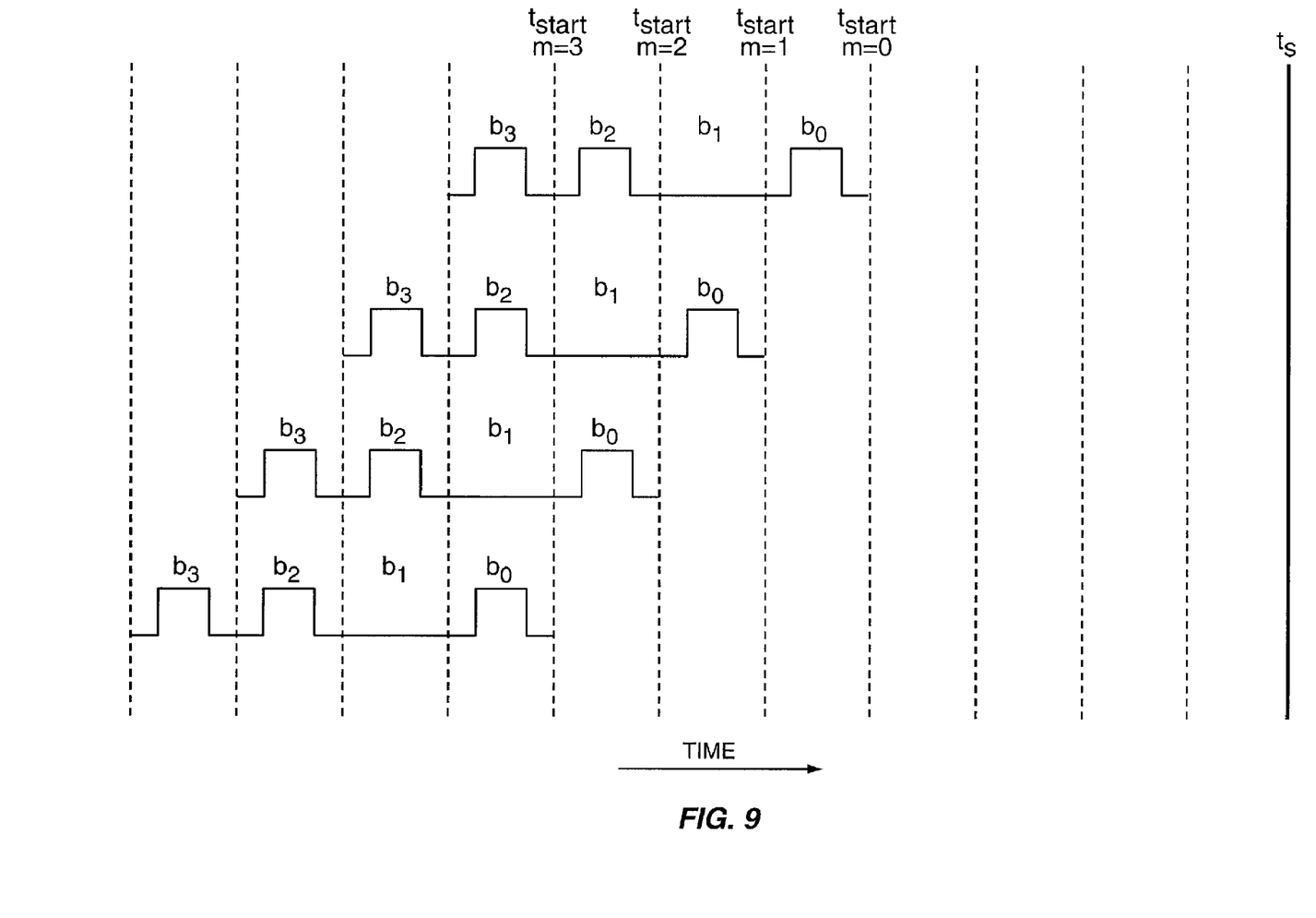
FIG. 9 shows a timing diagram for advancing input pulses relative to a fixed sampling time for the digital-to-analog converter of FIG. 3.

To implement the digital-to-analog conversion for floating point and logarithmic values, controller 40 controls the timing of the input of the pulses relative to the sample time based on the exponent. In one embodiment, controller 40 may control the timing by delaying the sample time of the decay circuit 30 by m periods. FIG. 8 shows the sample times $t_s$ for the 4-bit digital word "1011" when m=0, m=1, m=2, and m=3. In another embodiment, controller 40 may control pulse generator 20 to advance the input of the pulses by m periods relative to a fixed sample time $t_s$ to control the timing. FIG. 9 shows the pulses output by pulse generator 20 for "1011" when m=0, m=1, m=2, and m=3. Controller 40 may, for example, use a counter to track the number of delayed or advanced periods. In either case, the response for the magnitude decays for m periods before being sampled by sample circuit 50. It will be appreciated that while FIGS. 8 and 9 illustrate the invention in terms of integer exponent values, those skilled in the art will understand that fractional exponent values used for logarithmic formats can be used.

Figure 10:
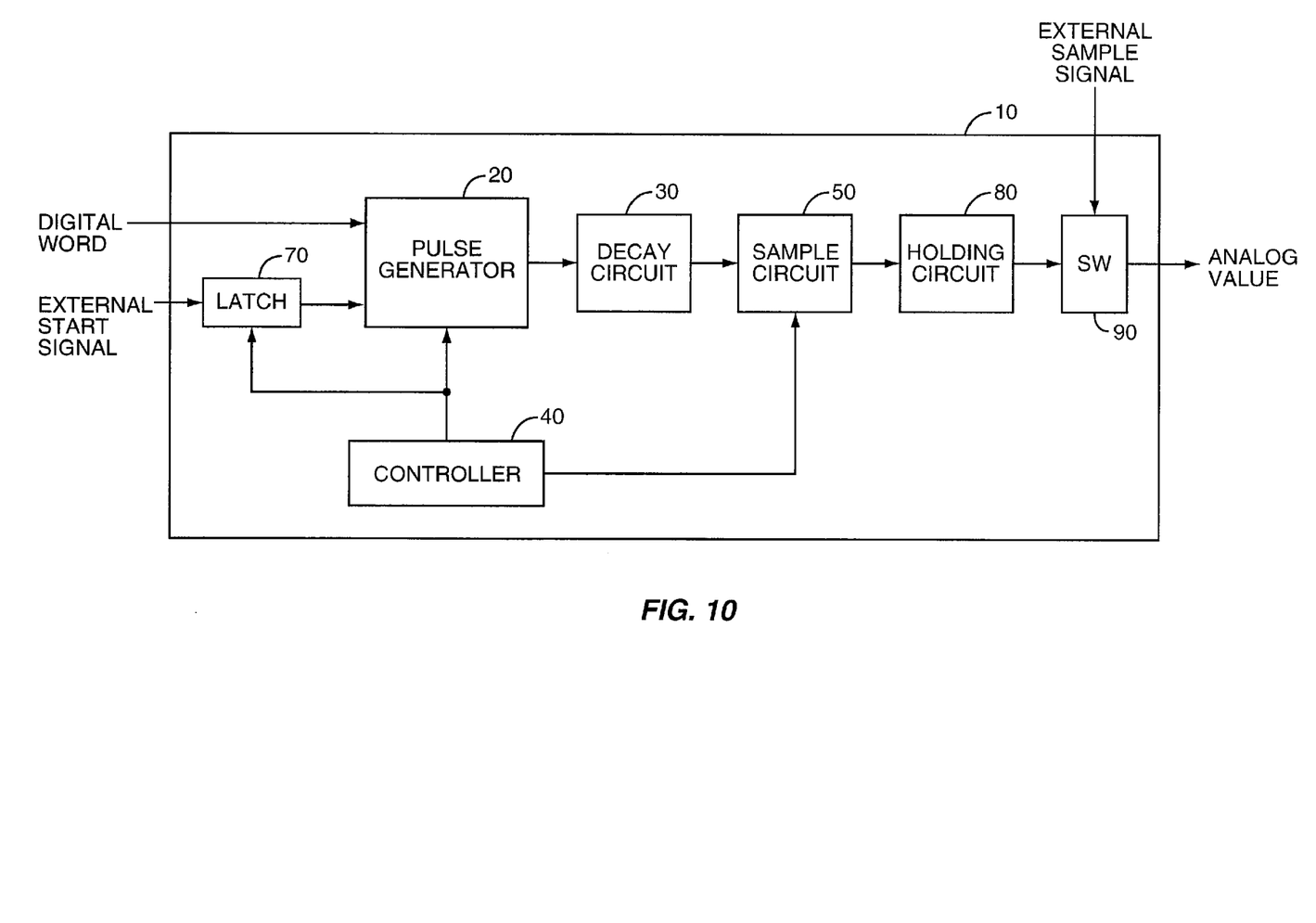
FIG. 10 shows a block diagram of another embodiment of the digital-to-analog converter for floating point and/or logarithmic digital words.

Because floating point and logarithmic words require additional delay time between the input and sample times, DAC 10 may require additional timing circuitry to synchronize the internal DAC timing with the timing of the external world. FIG. 10 shows one exemplary block diagram of a DAC 10 for this embodiment. In addition to the above-discussed components, DAC 10 includes a latch 70, holding circuit 80, and switch 90. Latch 70 receives an external start signal. When clocked by an internal start signal provided by controller 50, latch 70 provides a retimed start signal to pulse generator 20.

Responsive to the retimed start signal, pulse generator 20 receives the digital word and serially inputs the corresponding pulses ordered from LSB to MSB to decay circuit 30. Decay circuit 30 decays the response generated by the input pulses as discussed above. Responsive to an internal sample signal from controller 40, sample circuit 50 samples the output of decay circuit 30. The sample circuit 50 transfers the analog output signal to holding circuit 80. Holding circuit 80 holds the signal until switch 90 is triggered by an external sample signal. Subsequently, holding circuit 80 transfers the analog output signal to the output of DAC 10. Thus, as long as the time between the external start signal and the external sample signal is greater than the time between the internal start signal and the internal sample signal, the internal timing of the DAC 10 is invisible to the external world. This arrangement allows controller 40 to control the timing of the input pulses relative to the sample time to accommodate digital words in a fixed point, floating point, or logarithmic format without disrupting the timing operations of the external electrical components. This further allows controller 40 to add any necessary delay to reduce spurious signals.

Figure 11:
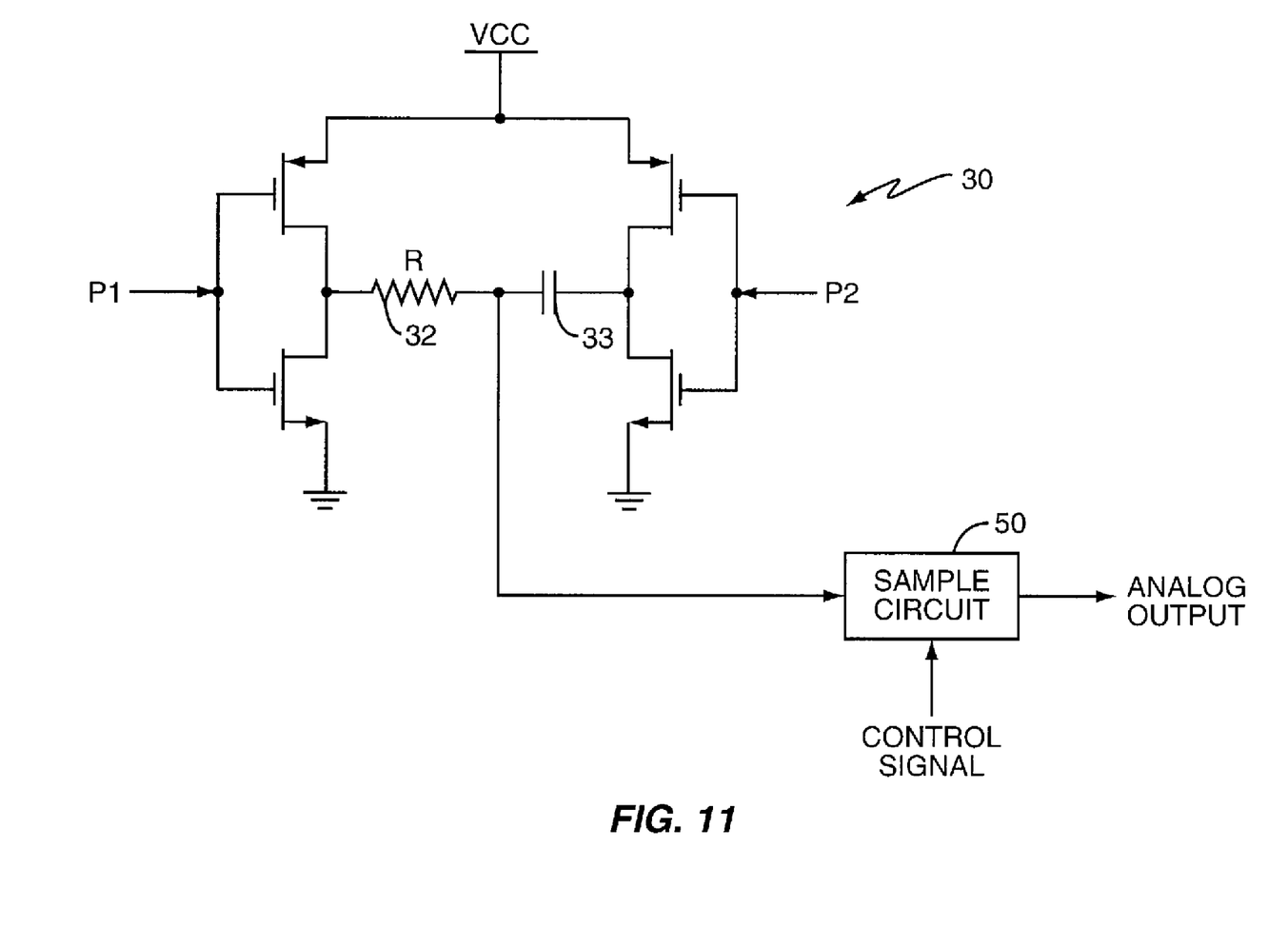
FIG. 11 shows a block diagram of another embodiment of the digital-to-analog converter for ternary digital words.
Figure 12A:
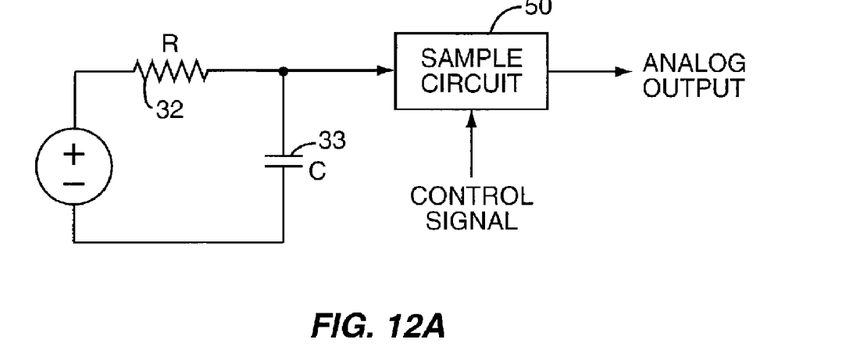
FIGS. 12A-12C show the different operating states of the digital-to-analog converter of FIG. 11.
Figure 12B:
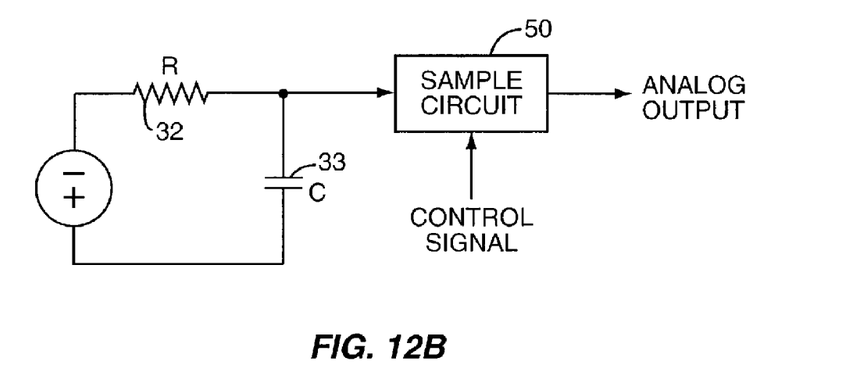
Figure 12C:
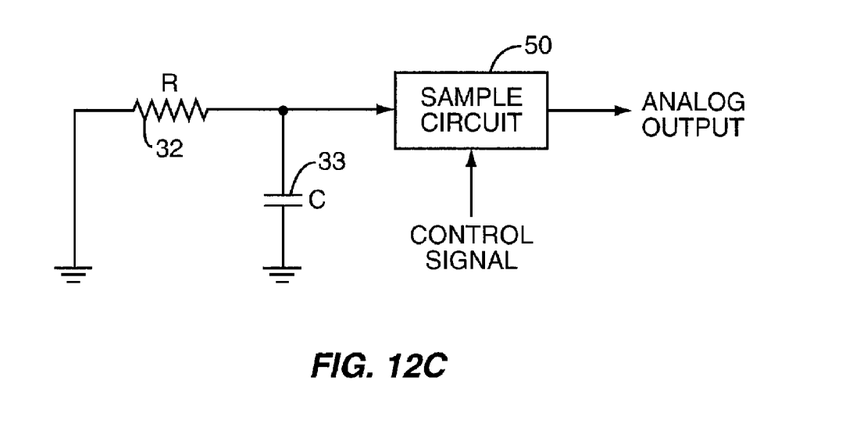

The present invention also applies to digital words of other radixes, such as a=3 (ternary), a=4 (quaternary), etc. FIG. 11 shows one exemplary decay circuit 30 for ternary digital words. A ternary system may use +1, 0, or −1 to generate a digital word. For this example, controller 40 may control the input pulse timing relative to the decay response such that a period T of each pulse corresponds to a nominal decay factor of 3. Decay circuit 30 comprises RC circuit 31 connected to a DC power source Vcc and ground via two inverters. Each inverter comprises a P-FET and an N-FET controlled by an input signal P1 or P2. Controller 40 controls input signals P1 and P2 based on each digit of the ternary digital word. When the digit is "+1," controller sets P1 to high and P2 to low. This charges the capacitor by connecting resistor 32 to Vcc and capacitor 33 to ground, as shown in FIG. 12A. When the digit is "−1," controller sets P1 to low and P2 to high. This discharges the capacitor 33 by connecting resistor 32 to ground and capacitor 33 to Vcc, as shown in FIG. 12B. When the digit is "0," controller 40 sets both P1 and P2 to low. This connects both the resistor 32 and the capacitor 33 to ground, as shown in FIG. 12C, which holds the charge in the capacitor 33. Thus, by controlling P1 and P2 based on the ternary digit value, the capacitor voltage may be increased, decreased, or maintained in each ternary digit period.

Figure 13:
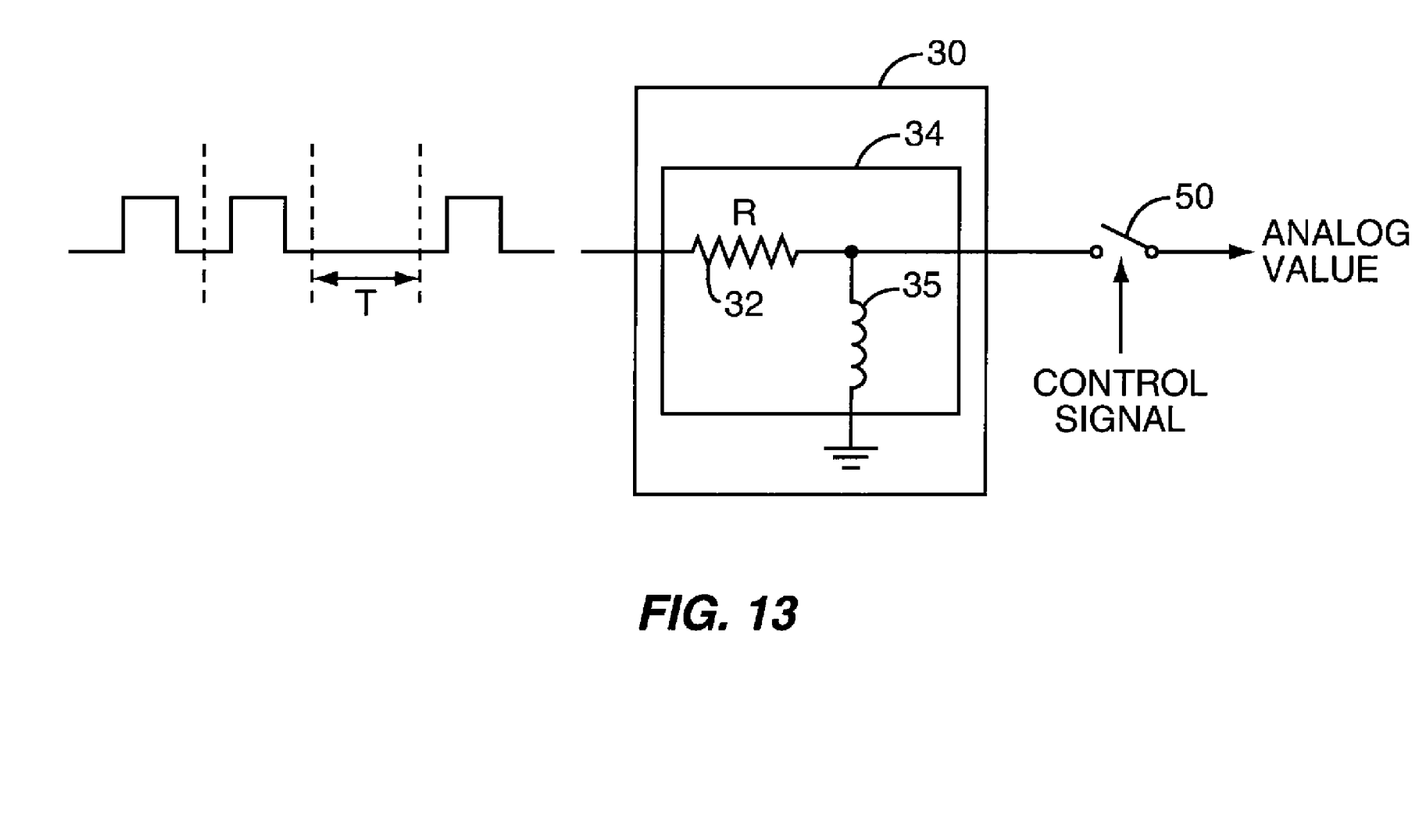
FIG. 13 shows another exemplary decay circuit for the digital-to-analog converter of FIG. 3.

It will be appreciated that the present invention may be implemented with other decay responses other than those discussed above. For example, RC circuit 31 may be modified to comprise a resistor 32 and a capacitor 33 in parallel. This configuration exponentially decays the response generated by the input current pulses to generate the corresponding analog output value. Alternatively, decay circuit 30 may comprise an RL circuit 34 as shown in FIG. 13. In this embodiment, controller 40 controls the timing of the input of the pulses relative to the decay response of the RL circuit 34 according to:

$$T = \frac{L}{R}\ln(a), \quad (5)$$

where R represents the resistance of resistor 32 in ohms, L represents the inductance of inductor 35 in Henrys, and τ=L/R represents the time constant of the RL circuit. Regardless of which exponential decay circuit is used, the decaying output signal is sampled by sample circuit 50 to generate the analog output value. Generally, the sampled value comprises an analog output voltage. However, when the decaying output signal is a decaying current signal, a current detector, such as a Hall-effect device or a transconductance amplifier, may be used to detect the current of the sampled analog output signal and generate the corresponding analog voltage.

The exemplary DAC 10 described above assumes that the input digital words are unipolar. The present invention may also be used as a bi-polar digital-to-analog converter that converts positive and negative numbers. According to one embodiment, the half full-scale bit pattern represents zero. For a 16-bit word, the half full-scale bit pattern is "0111111111111111," and the voltage output by the DAC 10 for this input digital word is defined to be zero. All voltages below this value are defined as negative values, while all voltages above this value are defined as positive values. Alternatively, there may be no true zero value. For example, −0.5 may be represented by "0111111111111111" and +0.5 may be represented by "1000000000000000."

In another bi-polar embodiment, a pair of DACs 10 may be used to build a balanced converter. In this case, the number to be converted may be in twos complement form, or in sign-magnitude form. In sign-magnitude form for 16-bit digital words, the sign is a one (for +) or zero (for −), and the magnitude is a 15-bit number where, for example, −0.5 is represented by "011111111111111" and +0.5 is represented by "100000000000000." By presenting sign*magnitude to one DAC 10 and the complementary bit pattern to the other DAC 10, a balanced or push-pull representation of the corresponding analog value is provided by the difference between the two voltages output by the pair of DACs 10. It will be appreciated that the present invention is not limited to the above examples. Other implementations for bi-polar digital-to-analog conversion using DAC 10 are also applicable to the present invention.

The DAC 10 described herein also assumes that the input series of pulses have a return-to-zero waveform. Using a waveform that returns to zero between bits ensures that each bit has the same rising and falling edges and the bit width, and will thus contribute the same amount of input signal to the DAC 10. As a result, the decay response of the decay circuit 30 modifies each input pulse in the same manner regardless of the bit position within the input digital word. While return-to-zero waveforms improve the accuracy of the analog output, it will be appreciated that other input waveforms may be used with the present invention.

The DAC 10 described herein requires only a few electronic components to implement, where the number of components is independent of the length of the digital word. Further, the accuracy of the DAC 10 described herein may be calibrated and/or dynamically controlled using a programmable frequency synthesizer 42. Such digital control is easier, cheaper, and more accurate than manufacturing the precision electronic components required for conventional digital-to-analog converters. In addition, DAC 10 may be used for all digital words independent of word length, radix, and/or format. Thus, the DAC 10 described herein is a versatile digital-to-analog converter that provides fast, simple, and highly accurate digital-to-analog conversion.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of converting a digital word comprising a plurality of digits into an analog value, the method comprising:
    serially inputting pulses representing the digits of the digital word ordered from least significant digit to most significant digit into a decay circuit having a decay response;
    controlling the timing of the pulses based on the decay response, using a programmable frequency synthesizer, such that a period of each pulse relates to a predetermined decay amount; and
    sampling an output of the decay circuit at a sample time after inputting the pulse representing the most significant digit to generate the analog value corresponding to the digital word.

2. The method of claim 1 wherein the decay response comprises an exponential decay response.

3. The method of claim 1 wherein the decay circuit comprises a resistor-capacitor (RC) circuit having an exponential decay response based on a timing constant of the RC circuit.

4. The method of claim 1 wherein the decay circuit comprises a resistor-inductor (RL) circuit having an exponential decay response based on a timing constant of the RL circuit.

5. The method of claim 1 wherein sampling the output of the decay circuit comprises varying the sample time relative to a start time for inputting the pulses to attenuate spurious signals in the analog value.

6. The method of claim 1 further comprising varying a start time for inputting the pulses relative to the sample time to attenuate spurious signals in the analog value.

7. The method of claim 1 further comprising forming a zero in a frequency response associated with the decay circuit based on a first order coefficient of one or more incidental poles of the frequency response to attenuate spurious signals in the analog value.

8. The method of claim 1 wherein the digital word comprises a magnitude and an exponent.

9. The method of claim 8 wherein the digital word comprises a digital word in one of a floating point format and a logarithmic format.

10. The method of claim 8 wherein sampling the output of the decay circuit comprises varying the sample time relative to a start time for inputting the pulses as a function of the exponent.

11. The method of claim 8 further comprising varying a start time for inputting the pulses relative to the sample time as a function of the exponent.

12. The method of claim 1 wherein the digital word comprises a binary word, and wherein controlling the timing of the pulses comprises controlling the timing such that the period of each pulse corresponds to a nominal decay amount of one-half.

13. The method of claim 1 wherein the digital word comprises a ternary word, and wherein controlling the timing of the pulses comprises controlling the timing such that the period of each pulse relates to a nominal decay amount of one-third.

14. The method of claim 1 wherein the digital word comprises a plurality of digits in a fixed point format.

15. The method of claim 1 further comprising:
    measuring a temperature of the decay circuit; and
    adjusting the timing of the pulses based on the measured temperature.

16. The method of claim 1 wherein controlling the timing of the pulses comprises calibrating the period of each pulse such that the period of each pulse relates to the predetermined decay amount.

17. The method of claim 1 further comprising synchronizing an internal timing of the digital-to-analog converter with at least one external timing signal.

18. A digital to analog converter for converting a digital word comprising a plurality of digits into an analog value, the digital to analog converter comprising:
    a pulse generator configured to serially output pulses representing the digits of the digital word ordered from least significant digit to most significant digit;
    a decay circuit having a decay response and configured to receive the pulses output by the pulse generator;
    a sample circuit configured to sample an output of the decay circuit at a sample time after the decay circuit receives the pulse representing the most significant digit to generate the analog value; and
    a controller configured to control, using a programmable frequency synthesizer, the timing of the pulses output by the pulse generator, wherein the controller is configured to control a period of each pulse, based on the decay response, such that the period of each pulse relates to a predetermined decay amount.

19. The digital-to-analog converter of claim 18 wherein the decay response comprises an exponential decay response.

20. The digital-to-analog converter of claim 18 wherein the decay circuit comprises a resistor-capacitor (RC) circuit having an exponential decay response based on a timing constant of the RC circuit.

21. The digital-to-analog converter of claim 18 wherein the decay circuit comprises a resistor-inductor (RL) circuit having an exponential decay response based on a timing constant of the RL circuit.

22. The digital-to-analog converter of claim 18 wherein the sample circuit is configured to vary the sample time relative to a start time for the pulse generator to attenuate spurious signals in the analog value.

23. The digital-to-analog converter of claim 18 wherein the controller is further configured to vary a start time for the pulse generator relative to the sample time to attenuate spurious signals in the analog value.

24. The digital-to-analog converter of claim 18 wherein the digital word comprises a magnitude and an exponent.

25. The digital-to-analog converter of claim 24 wherein the digital word comprises a digital word in one of a floating point format and a logarithmic format.

26. The digital-to-analog converter of claim 24 wherein the sample circuit is configured to vary the sample time relative to a start time for the pulse generator as a function of the exponent.

27. The digital-to-analog converter of claim 24 wherein the controller is further configured to vary a start time for the pulse generator relative to the sample time as a function of the exponent.

28. The digital-to-analog converter of claim 18 wherein the digital word comprises a binary word, and wherein the controller is configured to control the timing of the pulses such that the period of each pulse corresponds to a nominal decay amount of one-half.

29. The digital-to-analog converter of claim 18 wherein the digital word comprises a ternary word, and wherein the controller is further configured to control the timing of the pulses such that the period of each pulse relates to a nominal decay amount of one-third.

30. The digital-to-analog converter of claim 18 wherein the digital word comprises a plurality of digits in a fixed point format.

31. The digital-to-analog converter of claim 18 wherein the controller is further configured to:
   measure a temperature of the decay circuit; and
   adjust the timing of the pulses based on the measured temperature.

32. The digital-to-analog converter of claim 18 wherein the controller is further configured to calibrate the period of each pulse such that the period of each pulse relates to the predetermined decay amount.

33. The digital-to-analog converter of claim 18 further comprising:
   a latch configured to synchronize an external start signal with an internal start signal for the pulse generator; and
   a switch configured to synchronize the sample time with an external sample time.

34. The digital-to-analog converter of claim 18 wherein the digital-to-analog converter comprises at least one of a uni-polar digital-to-analog converter and a bi-polar digital-to-analog converter.

* * * * *